United States Patent [19]
Kellenberger

[11] Patent Number: 5,649,321
[45] Date of Patent: Jul. 15, 1997

[54] METHOD AND APPARATUS FOR DETERMINING AUDIO BAND ENERGY OF A SQUELCH CIRCUIT INPUT SIGNAL

[75] Inventor: Jane Ann Kellenberger, Bloomingdale, Ill.

[73] Assignee: Motorola, Inc., Schaumburg, Ill.

[21] Appl. No.: 435,359

[22] Filed: May 5, 1995

[51] Int. Cl.[6] ................................ H04B 1/10
[52] U.S. Cl. .................. 455/221; 455/212; 455/213
[58] Field of Search .................... 455/212, 213, 455/214, 218, 219, 220, 221, 222, 223, 224, 225; 381/94, 106; 333/14

[56] References Cited

U.S. PATENT DOCUMENTS

| | | | |
|---|---|---|---|
| 3,979,679 | 9/1976 | Bush et al. | 455/213 |
| 4,607,390 | 8/1986 | Faugeron | 455/212 |
| 4,893,347 | 1/1990 | Eastmond et al. | 455/212 |
| 5,255,319 | 10/1993 | Nakamura et al. | 455/212 |
| 5,349,701 | 9/1994 | Lobel | 455/212 |
| 5,355,530 | 10/1994 | Ikeda | 455/212 |
| 5,398,286 | 3/1995 | Balestri et al. | 381/94 |
| 5,408,694 | 4/1995 | Tran | 455/212 |

*Primary Examiner*—Reinhard J. Eisenzopf
*Assistant Examiner*—Sam Bhattachavya
*Attorney, Agent, or Firm*—Daniel C. Crilly

[57] ABSTRACT

A squelch circuit (111) that is contained in an communications receiver (100) estimates (403, 405) the energy of an input signal in an audio band and in a first portion of the audio band. The squelch circuit (111) then determines (407) whether the energy in the first portion of the audio band is at least a predetermined proportion of the total energy in the audio band. When the energy in the first portion of the audio band is at least a predetermined proportion of the total energy in the audio band, the squelch circuit increases (409) the audio band energy estimate to produce an updated audio energy estimate. The squelch circuit (111) can then use the updated audio energy estimate to adjust (413) a so-called squelch threshold that is subsequently used to determine (419) the presence of the radio frequency signal at an input (101) to the communications receiver (100).

19 Claims, 3 Drawing Sheets

METHOD AND APPARATUS FOR DETERMINING AUDIO BAND ENERGY OF A SQUELCH CIRCUIT INPUT SIGNAL

FIELD OF THE INVENTION

The present invention relates generally to FM communications receivers and, in particular, to a method and apparatus for determining audio band energy of an input signal to a squelch circuit contained in a communications receiver.

BACKGROUND OF THE INVENTION

Frequency modulation (FM) communication receivers are known to comprise a receiver frontend, a discriminator, and a squelch circuit. The receiver frontend includes filters, amplifiers, and downconverters that downconvert a received FM radio frequency signal to an intermediate frequency (IF) signal. The IF signal is typically filtered with an IF filter to remove frequency components outside a desired IF bandwidth. The discriminator demodulates the IF filter's output signal to produce a baseband signal that includes frequency components in a desired audio band and noise.

The squelch circuit receives the demodulated output of the discriminator and detects the presence of an FM modulated radio frequency signal at an input (e.g., an antenna) to the FM receiver. The squelch circuit measures the noise energy of the discriminator's output signal in a frequency band above the desired audio band. For example, if the desired audio band is 0–3 kilohertz (kHz) and the discriminator output signal has frequency components in the 0–40 kHz frequency range, the squelch circuit typically measures noise energy of the discriminator output signal in the 5–20 kHz range. The noise energy in the discriminator output signal varies as a function of the received signal strength and the FM deviation used to modulate the radio frequency signal present at the input to the receiver. The noise energy decreases as the signal strength of the input FM signal increases and increases as the FM deviation increases.

FIG. 3 illustrates typical plots 303, 305, 307 of noise magnitude in the receiver's discriminator output signal. Plot 303 exemplifies the noise magnitude when an unmodulated radio frequency signal 301 is received by the receiver. Plot 305 exemplifies the noise magnitude when an FM radio frequency signal 301 is received by the receiver. Plot 307 exemplifies the noise magnitude when no radio frequency signal is present at the receiver's input. As shown in FIG. 3, the noise magnitude, and accordingly noise energy, in the discriminator's output signal is maximum when no radio frequency signal is present and minimum when an unmodulated radio frequency signal 301 is present. As also depicted in the plots 303, 305, 307, the noise energy with a modulated radio frequency signal approaches the noise energy with no radio frequency signal. Further, as the FM deviation of the input FM signal is increased, the noise in the discriminator output also increases and more closely approaches the noise energy with no radio frequency signal present.

The squelch circuit uses the measured noise energy to detect the presence of the FM input signal. The squelch circuit detects the presence of an FM signal when the noise energy in the discriminator output signal decreases below a so-called squelch threshold. The squelch threshold corresponds to the minimum signal energy level at which the squelch circuit will acknowledge the presence of an unmodulated radio frequency signal at the input to the communications receiver. When the squelch circuit detects the presence of the FM radio frequency signal, the squelch circuit sends a control signal to the audio gating portion of the receiver, thereby allowing a user of the receiver to receive the received audio. When the squelch circuit determines that no FM radio frequency signal is present, the squelch circuit sends another control signal to the audio gating portion of the receiver, thereby preventing the user from receiving any audio. However, when the squelch threshold is set to allow reception of FM signals having a particular signal strength and FM deviation, and the receiver receives a signal modulated with a higher deviation, the increase in detected noise energy due to the additional FM deviation often results in an erroneous decision by the squelch circuit (i.e., the squelch circuit determines that no FM signal is present when if fact an FM signal is present). This erroneous decision is known as squelch clamping.

To compensate for changes in discriminator output noise energy due to increased FM deviation, prior art squelch circuits estimate the FM deviation and use the estimated deviation to adjust (e.g., increase) the squelch threshold. The deviation is estimated by measuring the energy in the audio band (i.e., 0–3 kHz) of the discriminator output signal. As is known, the audio band energy is proportional to the FM deviation.

A problem arises with the prior art approaches in modem communication systems, such as those communication systems that comply with the Association of Public Safety Communication Officers Project 25 (APCO 25), which are moving toward narrower IF bandwidths for better spectrum efficiency. Receivers with IF bandwidths approximately equal to twice the transmitted modulation bandwidth inherently produce attenuation of significant sidebands (e.g., first order and second order sidebands) of the IF signal when the modulation frequency is approximately equal to one-half the IF bandwidth. The attenuation of the significant sidebands results in an error in the audio band energy estimate (and equivalently the FM deviation estimate) because the audio band energy, which is contained primarily in the significant sidebands, has been reduced by the narrow IF filter. Thus, the amount of error in the audio band energy estimate is a function of the modulation frequency. For example, an IF filter having a bandwidth of 5.6 kHz would attenuate significant sidebands of the IF signal when the modulation frequency was approximately 2.8 kHz; whereas, the IF filter would not attenuate significant sidebands of the IF signal when the modulation frequency was below 2.8 kHz. However, the prior art approaches do not compensate for the resulting reduction in audio band energy due to the narrow IF filter when the modulation frequency is approximately equal to one-half the IF bandwidth.

Therefore, a need exists for a method and apparatus that determine the audio band energy of a squelch circuit input signal in communication receivers using narrowband IF filters. Further, such a method and apparatus that compensate for the attenuation produced by a narrowband IF filter would be an improvement over the prior art.

DESCRIPTION OF A PREFERRED EMBODIMENT

Generally, the present invention encompasses a method and apparatus for determining the energy in an audio band of a squelch circuit's input signal. The squelch circuit, which is contained in a frequency modulated (FM) communications receiver, estimates the energy of the input signal in the audio band and in a first portion of the audio band. The squelch circuit then determines whether the energy in the first portion of the audio band is a predetermined proportion of the total energy in the audio band. When the energy in the first portion is a predetermined proportion of the total energy in the audio band, the squelch circuit increases the audio band energy estimate to produce an updated audio energy estimate. The squelch circuit can then use the updated audio energy estimate to adjust a so-called squelch threshold that is subsequently used to determine the presence of the radio frequency signal at an input to the communications receiver. By determining the energy in the audio band of the squelch circuit's input signal in this manner, the present invention accounts for attenuation of frequency components in the first portion of the audio band (e.g., due to significant side bands of the modulated signal being located near the upper or lower edges of an intermediate frequency (IF) bandpass filter's passband) when the energy in the first portion of the audio band is a substantial proportion of the energy in the audio band (i.e., when most, if not all, the audio band energy is due to frequency components in the first portion of the audio band). Therefore, with the present invention, the probability of squelch clamping due to an errant FM deviation estimate is significantly reduced compared to prior art squelch techniques, thereby permitting FM communications receivers to utilize narrower band IF filters without sacrificing squelch performance.

Figure 1:
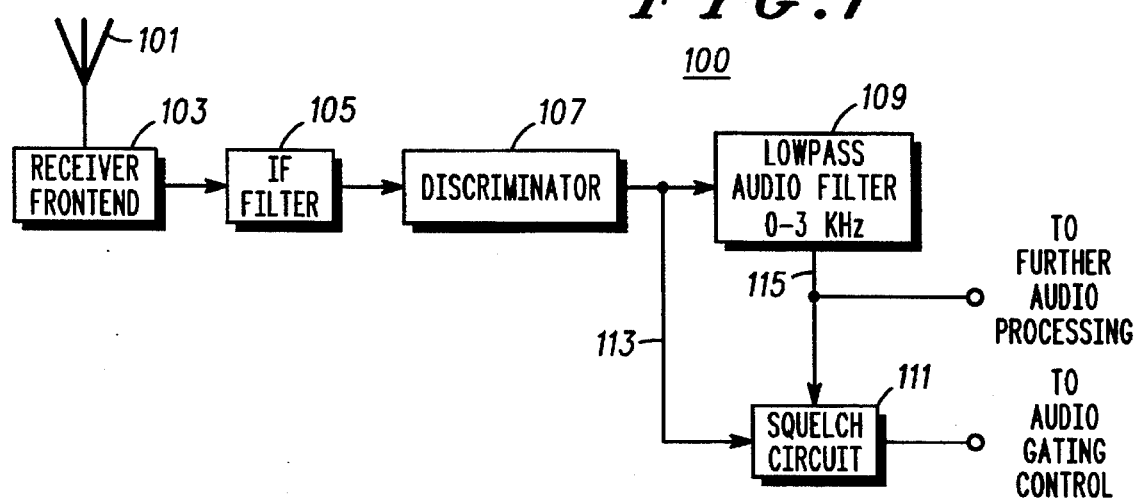
FIG. 1 illustrates an FM communications receiver in accordance with the present invention.
Figure 2:
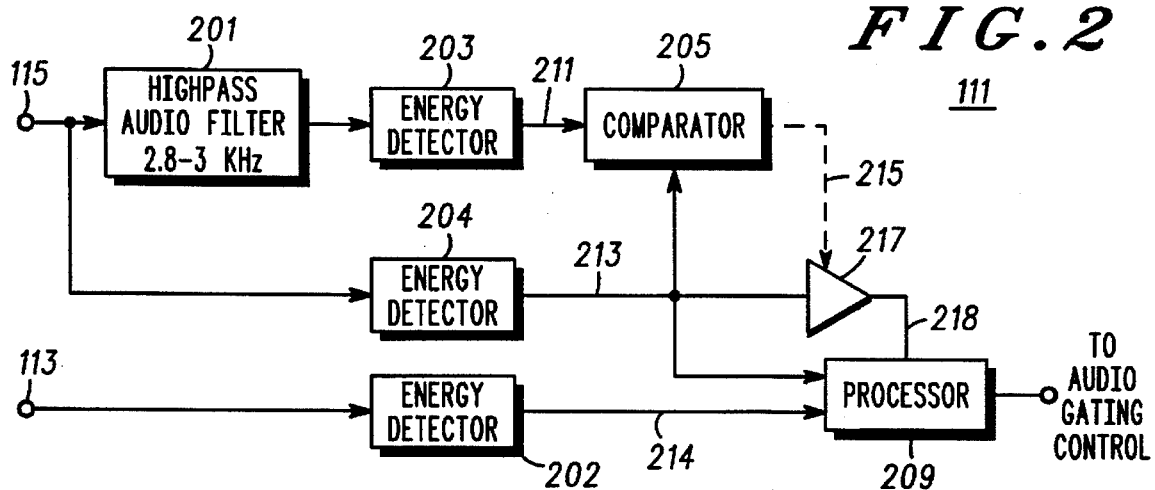
FIG. 2 illustrates a squelch circuit in accordance with a preferred embodiment of the present invention.
Figure 3:
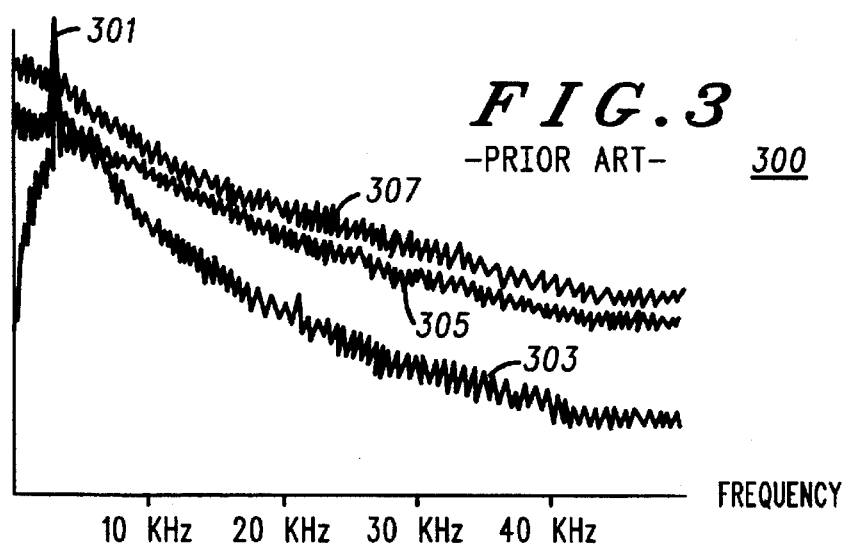
FIG. 3 illustrates typical plots of noise amplitude in an FM communications receiver.
Figure 4:
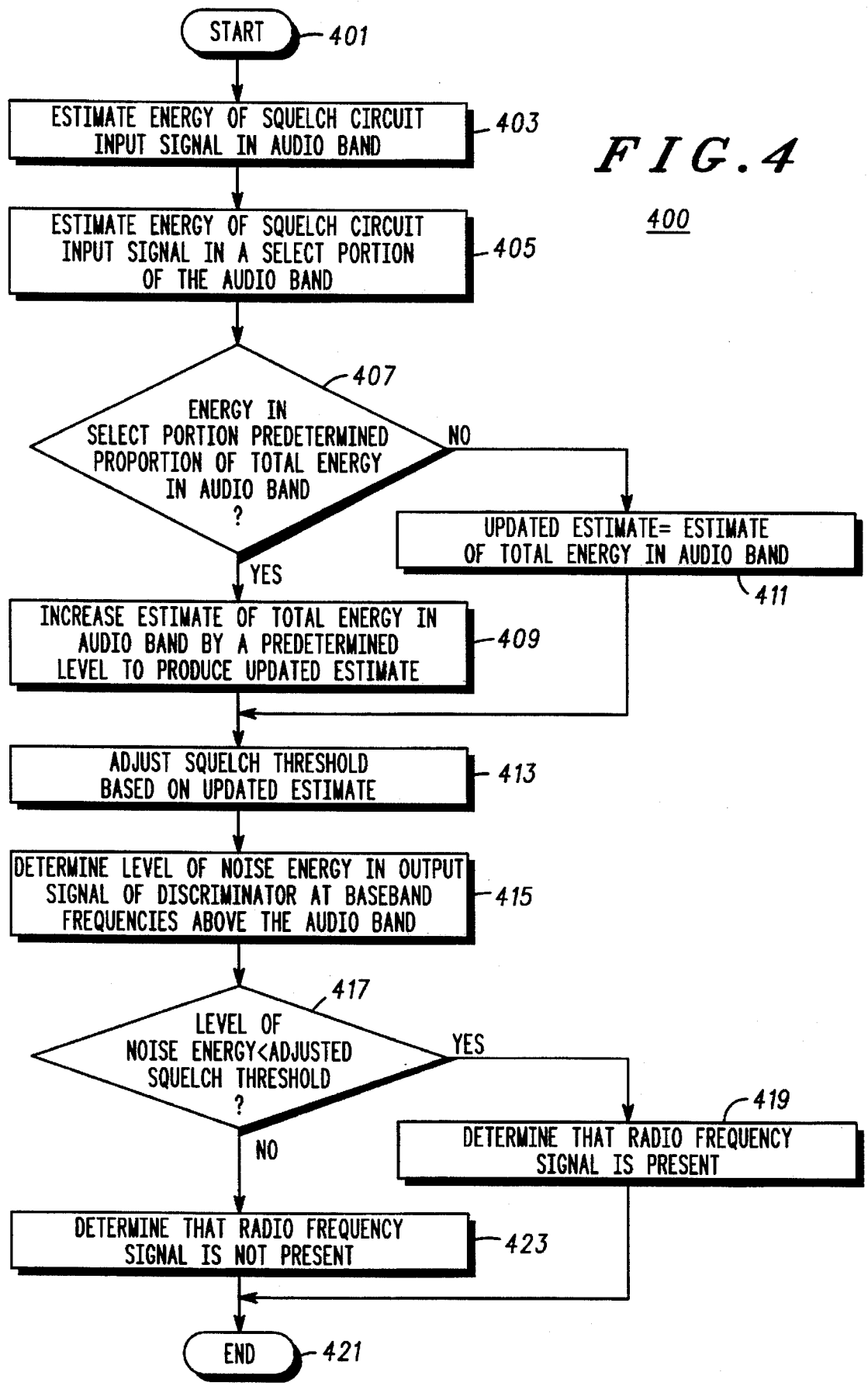
FIG. 4 illustrates a logic flow diagram of steps executed in a squelch circuit to detect the presence of an FM radio frequency signal at an input to an FM communications receiver in accordance with a preferred embodiment of the present invention.

The present invention can be more fully understood with reference to FIGS. 1, 2, and 4. FIG. 1 illustrates an FM communications receiver 100 in accordance with the present invention. In a preferred embodiment, the communications receiver 100 resides in a communication unit, such as a base station, mobile radio, or portable radio. The communications receiver 100 includes an antenna 101, a receiver frontend 103, an IF filter 105, a discriminator 107, a lowpass audio filter 109, and a squelch circuit 111. The receiver frontend 103 is well-known in the art and includes filters, amplifiers, and downconverters to produce an output signal centered at a final IF frequency. In a preferred embodiment, the final IF frequency is zero and the output signal of the receiver frontend 103 contains frequency components in the 0–10 kilohertz (kHz) range. The IF filter 105 preferably comprises a narrowband lowpass filter with a 3 decibel (dB) cutoff at approximately 2.8 kHz. However, in an alternate embodiment, the IF filter 105 might comprise a narrowband bandpass filter if the IF is higher in frequency than zero. The discriminator 107 is a well-known FM demodulator and, in a preferred embodiment, produces an output signal 113 having energy in the 0–10 kHz frequency range.

Operation of the communications receiver 100 in accordance with the present invention occurs substantially as follows. The antenna 101 receives an input signal (e.g., an FM radio frequency signal) and forwards the received signal, via a transmission line, to the receiver frontend 103. The receiver frontend 103 filters and downconverts the received signal to an IF signal having frequency components in the 0–10 kHz range. The IF signal, which includes modulated voice and noise, is filtered by the IF filter 105 to attenuate frequency components above the IF filter's cutoff frequency (e.g., 2.8 kHz). However, since the modulation frequency of the FM signal typically resides in the audio band (i.e., 0–3 kHz), the narrowband IF filter 105 also attenuates significant sidebands of the IF signal when the modulation frequency is in the upper portion of the audio band (e.g., 2.8–3 kHz.).

The filtered output of the IF filter 105 is provided to the discriminator 107 for demodulation. The output signal 113 of the discriminator 107, which includes the audio signal and noise, is a wideband signal providing energy in the 0–10 kHz frequency range. As shown, the discriminator output signal 113 is then provided to the lowpass audio filter 109 and the squelch circuit 111. The lowpass audio filter 109 preferably attenuates frequency components of the discriminator output signal 113 residing above approximately 3 kHz (i.e., noise) to extract the audio signal 115 from the discriminator output signal 113. The audio signal 115, which also contains noise in the audio band, is provided to the squelch circuit 111 and the audio processing portion (not shown) of the communications receiver 100.

The squelch circuit 111 receives the discriminator output signal 113 and the audio signal 115 and uses the signals 113, 115 to determine whether an FM radio frequency signal is actually present at the antenna 101. The squelch circuit 111 estimates the energy of the audio signal 115 in the complete audio band (i.e., 0–3 kHz) and estimates the energy of frequency components of the audio signal 115 residing in an upper portion (e.g., 2.8–3 kHz) of the audio band. In a preferred embodiment, the upper portion is selected because the IF filter 105 had attenuated significant sidebands of the IF signal when the modulating signal was in the 2.8–3 kHz range, thereby resulting in attenuation of the audio signal 115 in the upper portion.

Once the two energies are estimated, the squelch circuit 111 multiplies the total audio energy by a predetermined multiplier (e.g., 0.9) to produce a modified total audio energy, and compares the modified total audio energy to the upper portion energy. Based on the comparison, the squelch circuit 111 determines whether the upper portion energy is a predetermined proportion of the total audio energy. When the modified total audio energy is less than the upper portion energy (i.e., when the energy in the upper portion of the audio band accounts for at least 90% of the total energy in the audio band), the squelch circuit 111 increases the energy estimate of the total energy in the audio band to compensate for the attenuation of the frequency components in the upper portion by the narrowband IF filter 105. In a preferred embodiment, the squelch circuit 111 increases the estimate of the total energy in the audio band by 1.76 dB (i.e., 50 %) when the energy in the upper portion accounts for at least 90% of the energy in the total audio band.

Once the squelch circuit 111 produces the updated audio energy estimate, the squelch circuit 111 uses the updated energy estimate to detect the presence of the radio frequency carrier at the input (i.e., antenna 101) to the communications receiver 100. The squelch circuit 111 detects the presence of an FM radio frequency signal by comparing the level of noise energy in the discriminator output signal 113 residing in a bandwidth that is above the audio band to a so-called squelch threshold. The squelch threshold corresponds to the minimum signal energy level at which the squelch circuit will acknowledge the presence of an unmodulated radio frequency signal at the input to the communications receiver 100. However, the presence of frequency modulation on the radio frequency signal increases the noise energy in the discriminator output signal 113 residing in a bandwidth above the audio band. An increase in FM deviation is detected as an increase in the updated energy estimate. Therefore, the squelch circuit 111 increases the squelch threshold as the updated energy estimate increases, to produce the adjusted squelch threshold. In a preferred embodiment, the squelch threshold is adjusted to maintain a minimum receiver sensitivity—for example, to receive a signal at a predetermined level (e.g., −100 dBm) or to receive a signal exhibiting a minimum signal quality metric (e.g., 12 dB signal-to-noise and distortion (SINAD)).

Upon determining the adjusted squelch threshold, the squelch circuit 111 determines whether the current input signal to the communications receiver 100 is an FM radio frequency signal based on the adjusted squelch threshold and a level of noise energy in the discriminator output signal 113 within a predetermined band (e.g., 3–10 kHz) outside the audio band (i.e., 0–3 kHz). The squelch circuit 111 determines the energy in the discriminator output signal 113 and subtracts the total energy of the audio signal 115 from the energy in the discriminator output signal 113 to produce a level of noise energy in the band (e.g., 3–10 kHz) excluding the audio band.

The squelch circuit 111 compares the level of noise energy to the adjusted squelch threshold and, when the level of noise energy is less than or equal to the adjusted squelch threshold, determines that the FM signal is present. However, if the level of noise energy is greater than the adjusted squelch threshold, the squelch circuit 111 determines that the FM signal is not present. When the squelch circuit 111 determines that the FM signal is present, the squelch circuit 111 sends a control signal to the audio gating control (not shown) that permits the audio to be provided to a user of the communications receiver 100. When the squelch circuit 111 determines that the FM signal is not present, the squelch circuit 111 sends a control signal to the audio gating control that prohibits the audio from being provided to a user of the communications receiver 100. Squelch circuit control of audio gating is well-known; thus, no further discussion will be provided except to facilitate an understanding of the present invention.

In a preferred embodiment, the squelch circuit 111 periodically (e.g., every 5 milliseconds) performs the above squelch threshold adjustment to account for changes in modulation frequency and FM deviation. In the preferred embodiment, the squelch circuit 111 returns the squelch threshold to its original reference setting—such that the squelch threshold corresponds to the minimum signal energy level at which the squelch circuit will acknowledge the presence of an unmodulated radio frequency signal at the input to the communications receiver 100—and then increases the squelch threshold to a new value based on the updated energy estimate. However, in an alternate embodiment, the squelch circuit 111 might simply increase or decrease the squelch threshold from its previous setting based on the updated energy estimate.

FIG. 2 illustrates a squelch circuit 111 in accordance with a preferred embodiment of the present invention. The squelch circuit 111 includes a highpass audio filter 201, a plurality of energy detectors 202–204, a comparator 205, a variable gain amplifier 217, and a processor 209. In the preferred embodiment, the squelch circuit 111 is implemented in a digital signal processor (DSP) that also includes the discriminator 107 and the IF filter 105 of FIG. 1. However, in an alternate embodiment, the energy detectors 202–204 might comprise diodes and single pole lowpass filters and the comparator 205 might comprise a known operational amplifier circuit.

Figure 5:
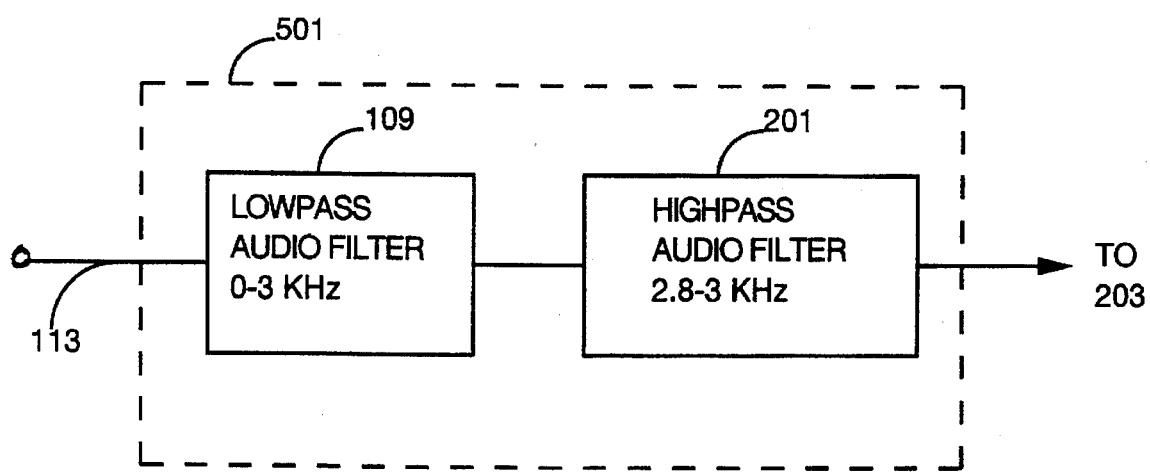
FIG. 5 illustrates application of a bandpass filter to a discriminator output signal to produce a signal in the upper portion of the audio band in accordance with the present invention.

Operation of the squelch circuit 111 occurs substantially as follows in accordance with the preferred embodiment of the present invention. The highpass audio filter 201 receives the audio signal 115 from the lowpass audio filter (109 in FIG. 1) and attenuates frequency components of the audio signal below 2.8 kHz to produce an output signal in the upper portion (i.e., 2.8–3 kHz) of the audio band. One of ordinary skill in the art will appreciate that the lowpass audio filter 109 and the highpass audio filter 201 together effectively form a bandpass audio filter having a passband of 2.8–3 kHz. Accordingly, in an alternate embodiment, the lowpass audio filter 109 and the highpass audio filter 201 might be replaced by a single bandpass audio filter (as illustrated by block 501 of FIG. 5) to produce the output signal in the upper portion (i.e., 2.8–3 kHz) of the audio band.

Energy detector 203 estimates the energy 211 of the highpass filtered signal in the upper portion of the audio band. In a preferred embodiment, the energy detector 203 squares audio signal sample amplitudes and sums the squares to produce the energy of audio signal 115 in the upper portion of the audio band. Similarly, energy detectors 204 and 202 estimate the total energy 213 in the audio signal 115 and the energy 214 in the discriminator output signal 113, respectively. The comparator 205 receives the upper portion energy estimate 211 and the total audio energy estimate 213, and, in a preferred embodiment, multiplies the total audio energy estimate 213 by a predetermined multiplier (e.g., 0.9) to produce a modified total audio energy estimate, and compares the modified total audio energy estimate to the upper portion energy estimate 211. Based on the comparison, the comparator 205 determines whether the upper portion energy estimate is a predetermined proportion of the total audio energy estimate 213 and generates a control signal 215 that is used to vary the gain of the variable gain amplifier 217. For example, when the modified total audio energy estimate is greater than the upper portion energy estimate 211 (i.e., the upper portion energy estimate 211 is less than 90% of the total audio energy estimate 213), the comparator 205 provides a control signal 215 that produces unity gain in the variable gain amplifier 217; whereas, when the modified total audio energy estimate is less than or equal to the upper portion energy estimate 211 (i.e., the upper portion energy estimate 211 is at least 90% of the total audio energy estimate 213), the comparator 205 provides a control signal 215 that produces 1.76 dB gain in the variable gain amplifier 217 to compensate for the reduction in upper portion energy caused by the IF filter (105 of FIG. 1). The variable gain amplifier 217 amplifies the total audio energy estimate 213 in response to the control signal 215 and provides the amplified, or updated, audio energy estimate 218 to the processor 209.

In an alternate embodiment, the comparator 205 might compute a ratio of the upper portion energy estimate to the estimate of the total energy in the audio band, and compare the ratio to a predetermined threshold (e.g., 0.9). In this case, when the ratio is greater than or equal to the predetermined threshold, the comparator 205 provides a control signal 215 that produces 1.76 dB gain in the variable gain amplifier 217 to compensate for the reduction in upper portion energy caused by the IF filter (105 of FIG. 1). Contrastly, when the ratio is less than the predetermined threshold, the comparator 205 provides a control signal 215 that produces unity gain in the variable gain amplifier 217.

The processor 209 receives the updated audio energy estimate 218 and determines an FM deviation based on the updated audio energy estimate 218 as discussed above with regard to FIG. 1. Upon determining the FM deviation, the processor 209 adjusts the squelch threshold based on the FM deviation. As also discussed above, the squelch threshold might be increased or decreased to account for an increase or decrease of the FM deviation, respectively.

The processor 209 also receives the audio energy estimate 213 and the energy estimate 214 of the discriminator output signal 113. The processor 209 subtracts the audio energy estimate 213 from the energy estimate 214 of the discriminator output signal 113 to determine a level of noise energy at baseband frequencies (e.g., 3–10 kHz) above the audio band (i.e., 0–3 kHz). The processor compares the level of noise energy to the adjusted squelch threshold and instructs the audio gating control to accept or reject the audio based on whether the level of noise energy is less than the adjusted squelch threshold. When the level of noise energy is less than the adjusted squelch threshold, the processor 209 instructs the audio gating control to accept the audio signal 115; however, when the level of noise energy is greater than or equal to the adjusted squelch threshold, the processor 209 instructs the audio gating control to reject the audio signal 115.

The present invention permits FM communications receivers to utilize narrowband IF filters (i.e., having passbands approximately equal to twice the FM modulation bandwidth) without negatively impacting squelch performance and thereby causing squelch clamping. In contrast to prior art approaches which estimate energy in the complete audio band only and do not account for attenuation in the audio band caused by a narrowband IF filter, the present invention examines the energy in the particular portion of the audio band affected by the IF filter and modifies the estimate of the audio band energy when the energy in the particular portion is a significant proportion of the total audio band energy. By modifying the audio energy estimate to account for the narrowband IF filter, the present invention permits input FM radio frequency signals having a substantial level of their audio energy in the particular portion of the audio band attenuated by the IF filter to be received and processed without the squelch circuit errantly instructing the audio gating control to reject the audio signal, when, in fact, the audio signal is strong enough to be processed.

FIG. 4 illustrates a logic flow diagram 400 of steps executed in a squelch circuit to detect the presence of an FM radio frequency signal at an input to an FM communications receiver in accordance with a preferred embodiment of the present invention. The logic flow begins (401) when the squelch circuit estimates (403) the total energy in the audio band of an input signal. In the preferred embodiment, the squelch circuit measures the energy in an audio band containing frequency components in the 0–3 kHz frequency range. In a similar manner, the squelch circuit estimates (405) the energy of the input signal in a select portion of the audio band. In the preferred embodiment, the select portion comprises, approximately, the upper five percent of the audio band (e.g., 2.8–3 kHz). The squelch circuit then determines (407) whether the energy in the select portion is a predetermined proportion of the total energy in the audio band. When the energy in the select portion is a predetermined proportion of the total energy in the audio band (e.g., when the energy in the select portion is greater than 90% of the total energy in the audio band), the squelch circuit increases (409) the estimate of the total energy in the audio band by a predetermined level (e.g., 1.76 dB) to produce an updated audio energy estimate. Alternatively, when the energy in the select portion is not a predetermined proportion of the total energy in the audio band (e.g., when the energy in the select portion is less than or equal to 90% of the total energy in the audio band), the squelch circuit sets (411) the updated audio energy estimate equal to the estimate of the total energy in the audio band.

Once the squelch circuit produces the updated audio energy estimate, it adjusts (413) the squelch threshold based on the updated estimate. As discussed above with regard to FIG. 1, the squelch threshold corresponds to the minimum signal energy level at which the squelch circuit will acknowledge the presence of an unmodulated radio frequency carrier at the input to the communications receiver. As also discussed above, the squelch threshold is increased as an increase in deviation is detected to produce an adjusted squelch threshold. An increase in deviation is detected as an increase in the updated audio energy estimate. Upon adjusting the squelch threshold, the squelch circuit determines (415) the level of noise energy in the discriminator output signal at baseband frequencies (e.g., 3–10 kHz) above the audio band (i.e., 0–3 kHz) and compares (417) the level of noise energy to the adjusted squelch threshold. When the level of noise energy is less than the adjusted squelch threshold, the squelch circuit determines (419) that the FM radio frequency signal is present and the logic flow ends (421). Contrastly, when the level of noise energy is greater than or equal to the adjusted squelch threshold, the squelch circuit determines (423) that the FM radio frequency signal is not present and the logic flow ends (421).

The present invention encompasses a method and apparatus for determining energy in an audio band of a squelch circuit input signal. With this invention, FM communications receivers can use narrowband IF filters without increasing the probability of experiencing undesired squelch clamping. In contrast to prior art squelch techniques, the present invention examines the energy in the particular portion of the audio band affected by the narrowband IF filter and modifies the estimate of the audio band energy when the energy in the particular portion is a significant proportion of the total audio band energy. By updating the estimate of the total audio band energy based on which portion of the audio band is providing most of the energy, the present invention permits received FM signals containing a substantial level of their audio energy in the portion of the audio band attenuated by the IF filter to be processed without the squelch circuit errantly instructing the audio gating control to reject the audio signal.

While the present invention has been particularly shown and described with reference to particular embodiments thereof, it will be understood by those skilled in the art that various changes in form and details may be made therein without departing from the spirit and scope of the present invention.

What I claim is:

1. In a squelch circuit of a communications receiver, a method for determining energy in an audio band of an input signal to the squelch circuit, the method comprising the steps of:

estimating an energy of the input signal in the audio band to produce a first audio energy estimate;

estimating an energy of the input signal in a first portion of the audio band to produce a second audio energy estimate;

when the second audio energy estimate is at least a predetermined proportion of the first audio energy estimate, increasing the first audio energy estimate to produce an updated audio energy estimate; and when the second audio energy estimate is less than the predetermined proportion of the first audio energy estimate, setting the updated audio energy estimate equal to the first audio energy estimate.

2. The method of claim 1, wherein the first portion of the audio band occupies at least an upper five percent of the audio band.

3. The method of claim 1, further comprising the step of:
prior to estimating the energy of the input signal in the first portion of the audio band, filtering the input signal with a highpass filter.

4. The method of claim 1, further comprising the step of:
prior to estimating the energy of the input signal in the first portion of the audio band, filtering the input signal with a bandpass filter.

5. The method of claim 1, wherein the step of increasing the first audio energy estimate further comprises the step of increasing the first audio energy estimate by a predetermined level to produce the updated audio energy estimate.

6. The method of claim 5, wherein the predetermined level is 1.76 decibels.

7. The method of claim 1, wherein the predetermined proportion is 90%.

8. The method of claim 1, wherein the squelch circuit detects a presence of a radio frequency signal at an input to the communications receiver based on a level of noise energy with respect to a squelch threshold, the noise energy being present in a predetermined band excluding the audio band, the method further comprising the steps of:
adjusting the squelch threshold based on the updated audio energy estimate to produce an adjusted squelch threshold;
comparing the adjusted squelch threshold to the level of noise energy; and
when the level of noise energy is less than the adjusted squelch threshold, determining that the radio frequency signal is present.

9. In a communications receiver containing a discriminator, a method for determining energy in an audio band of an output signal of the discriminator, the method comprising the steps of:
filtering the output signal of the discriminator with a lowpass filter to produce a first filtered signal having frequency components at least in the audio band;
estimating the energy of the first filtered signal in the audio band to produce a first audio energy estimate;
filtering the first filtered signal with a highpass filter to produce a second filtered signal in an upper portion of the audio band;
estimating an energy of the second filtered signal to produce a second audio energy estimate;
when a ratio of the second audio energy estimate to the first audio energy estimate is greater than or equal to a predetermined threshold, increasing the first audio energy estimate to produce an updated audio energy estimate; and
when the ratio of the second audio energy estimate to the first audio energy estimate is less than the predetermined threshold, setting the updated audio energy estimate equal to the first audio energy estimate.

10. The method of claim 9, wherein the upper portion of the audio band occupies at least an upper five percent of the audio band.

11. The method of claim 9, wherein the step of increasing the first audio energy estimate further comprises the step of increasing the first audio energy estimate by 1.76 decibels to produce the updated audio energy estimate.

12. The method of claim 9, wherein the communications receiver further includes a squelch circuit that detects a presence of a radio frequency signal at an input to the communications receiver based on a level of noise energy in the output signal of the discriminator with respect to a squelch threshold, the noise energy being present in a predetermined band excluding the audio band, the method further comprising the steps of:
adjusting the squelch threshold based on the updated audio energy estimate to produce an adjusted squelch threshold;
comparing the adjusted squelch threshold to the level of noise energy; and
when the level of noise energy is less than the adjusted squelch threshold, determining that the radio frequency signal is present.

13. In a communications receiver, a method for detecting a presence of a frequency modulated radio frequency signal in an input signal to the communications receiver, the method comprising the steps of:
receiving and demodulating the input signal to produce a baseband signal;
filtering the baseband signal with a lowpass filter to produce a first filtered signal in an audio band;
estimating an energy of the baseband signal to produce a baseband signal energy;
estimating an energy of the first filtered signal in the audio band to produce a first audio energy estimate;
subtracting the first audio energy estimate from the baseband signal energy to determine a level of noise energy at baseband frequencies above the audio band;
filtering the first filtered signal with a highpass filter to produce a second filtered signal in an upper portion of the audio band;
estimating an energy of the second filtered signal in the upper portion of the audio band to produce a second audio energy estimate;
when a ratio of the second audio energy estimate to the first audio energy estimate is greater than or equal to a predetermined threshold, increasing the first audio energy estimate to produce an updated audio energy estimate;
adjusting a squelch threshold based on the updated audio energy estimate to produce an adjusted squelch threshold;
comparing the adjusted squelch threshold to the level of noise energy; and
when the level of noise energy is less than the adjusted squelch threshold, determining that the frequency modulated radio frequency signal is present in the input signal.

14. In a communications receiver containing a squelch circuit, the squelch circuit comprising:
first means for estimating energy of an input signal in an audio band to produce a first audio energy estimate;
second means for estimating energy of the input signal in a first portion of the audio band to produce a second audio energy estimate; and
means, coupled to the first means for estimating and the second means for estimating, for increasing the first audio energy estimate by a predetermined level to produce an updated audio energy estimate when a ratio of the second audio energy estimate to the first audio energy estimate is greater than or equal to a predetermined threshold and for setting the updated audio energy estimate equal to the first audio energy estimate when the ratio of the second audio energy estimate to the first audio energy estimate is less than the predetermined threshold.

15. The squelch circuit of claim 14, further comprising:

means, coupled to the means for increasing, for adjusting a squelch threshold based on the updated audio energy estimate to produce an adjusted squelch threshold;

means, coupled to the means for adjusting, for comparing the adjusted squelch threshold to a level of noise energy, the noise energy being present in a predetermined band excluding the audio band; and means, coupled to the means for comparing, for determining that a radio frequency signal is present at an input to the communications receiver when the level of noise energy is less than the squelch threshold.

16. The squelch circuit of claim 14, wherein the second means for estimating comprises a highpass filter and an energy detector.

17. In a communications receiver containing a squelch circuit, the squelch circuit comprising:

a first energy detector that estimates an energy of an input signal in an audio band to produce a first audio energy estimate;

a highpass filter that attenuates low frequency components of the input signal to produce a filtered signal in an upper portion of the audio band;

a second energy detector, coupled to the highpass filter, that estimates an energy of the filtered signal in the upper portion of the audio band to produce a second audio energy estimate;

a variable gain amplifier that adjusts the first audio energy estimate in response to a control signal to produce an updated audio energy estimate; and a comparator, coupled to the first energy detector, the second energy detector, and the variable gain amplifier, that generates the control signal to produce a positive gain in the variable gain amplifier when the second audio energy estimate is at least a predetermined proportion of the first audio energy estimate and a unity gain in the variable gain amplifier when the second audio energy estimate is less than the predetermined proportion of the first audio energy estimate.

18. The squelch circuit of claim 17, further comprising:

a processor, coupled to the variable gain amplifier, that determines a presence of a radio frequency signal at an input to the communications receiver based on the updated audio energy estimate.

19. The squelch circuit of claim 17, further comprising:

means, coupled to the means for increasing, for adjusting a squelch threshold based on the updated audio energy estimate to produce an adjusted squelch threshold;

means, coupled to the means for adjusting, for comparing the adjusted squelch threshold to a level of noise energy, the noise energy being present in a predetermined band excluding the audio band; and means, coupled to the means for comparing, for determining that a radio frequency signal is present at an input to the communications receiver when the level of noise energy is less than the squelch threshold.

* * * * *